United States Patent
Bendel et al.

(10) Patent No.: US 10,655,996 B2
(45) Date of Patent: May 19, 2020

(54) SYSTEM AND METHOD FOR MEASURING VELOCITY PROFILES

(71) Applicant: Aspect Imaging Ltd., Shoham (IL)

(72) Inventors: Peter Bendel, Rishon LeZion (IL); Boaz Shapira, Eshhar (IL)

(73) Assignee: Aspect Imaging Ltd., Shoham (IL)

(*) Notice: Subject to any disclaimer, the term of this patent is extended or adjusted under 35 U.S.C. 154(b) by 593 days.

(21) Appl. No.: 15/484,665

(22) Filed: Apr. 11, 2017

(65) Prior Publication Data
US 2017/0292866 A1   Oct. 12, 2017

Related U.S. Application Data

(60) Provisional application No. 62/321,507, filed on Apr. 12, 2016.

(51) Int. Cl.
*G01F 1/716* (2006.01)
*G01N 24/08* (2006.01)
(Continued)

(52) U.S. Cl.
CPC ............ *G01F 1/716* (2013.01); *G01N 24/081* (2013.01); *G01R 33/4838* (2013.01); *G01R 33/56308* (2013.01)

(58) Field of Classification Search
CPC ............ G01R 33/563; G01R 33/56308; G01R 33/56341; G01R 33/5635; G01R 33/56366; G01R 33/3808; G01R 33/445; G01R 33/448; G01F 1/716; G01N 24/08; G01N 24/081; G01N 24/082; G01N 24/084; G01N 24/10; G01V 3/14; G01V 3/32
(Continued)

(56) References Cited

U.S. PATENT DOCUMENTS

| 2,768,529 A | 10/1956 | Hagler, Sr. |
| 3,175,403 A | 3/1965 | Nelson |

(Continued)

FOREIGN PATENT DOCUMENTS

| CN | 1236478 | 11/1999 |
| CN | 1291873 | 4/2001 |

(Continued)

OTHER PUBLICATIONS

A. Caprihan & E. Fukushima, Flow Measurements by NMR, 198 Phy. Reports 195-235 (Dec. 1990) (Year: 1990).*

(Continued)

*Primary Examiner* — Tung X Nguyen
*Assistant Examiner* — Robert P Alejnikov, Jr.
(74) *Attorney, Agent, or Firm* — Loeb & Loeb LLP

(57) ABSTRACT

Method of determining a velocity profile of a fluid flowing through a conduit, the method including applying a saturation pulse on spins of magnetic field-sensitive nuclei in the fluid, measuring a signal of the fluid to determine position of the magnetic field-sensitive nuclei, the measurement carried out at a recovery time 'TR' and at a distance 'd' within the conduit, determining within the conduit a radial distance 'r' characterized by a local minimum in the measured signal, wherein the radial distance 'r' is measured from the center of the conduit, and determining a velocity profile of the fluid at the radial distance, based on the magnetic field-sensitive nuclei.

14 Claims, 4 Drawing Sheets

(51) Int. Cl.
*G01R 33/563* (2006.01)
*G01R 33/483* (2006.01)

(58) Field of Classification Search
USPC .................................................. 324/303, 306
See application file for complete search history.

(56) References Cited

U.S. PATENT DOCUMENTS

| | | |
|---|---|---|
| 3,989,630 A | 11/1976 | Walker |
| 4,417,474 A | 11/1983 | Elderton |
| 4,468,622 A | 8/1984 | Frese et al. |
| 4,697,594 A | 10/1987 | Mayo, Jr. |
| 4,904,603 A | 2/1990 | Jones et al. |
| 4,994,746 A | 2/1991 | Panosh |
| 5,023,551 A | 6/1991 | Kleinberg et al. |
| 5,145,189 A | 9/1992 | Pope |
| 5,161,409 A | 11/1992 | Hughes et al. |
| 5,168,226 A | 12/1992 | Hinks |
| 5,208,534 A | 5/1993 | Okamoto et al. |
| 5,280,243 A | 1/1994 | Miler |
| 5,306,909 A | 4/1994 | Jones et al. |
| 5,479,925 A | 1/1996 | Dumoulin et al. |
| 5,532,593 A | 7/1996 | Maneval et al. |
| 5,557,103 A | 9/1996 | Hughes et al. |
| 5,557,201 A | 9/1996 | Kleinberg et al. |
| 5,696,448 A | 12/1997 | Coates et al. |
| 5,705,927 A | 1/1998 | Sezginer et al. |
| 5,757,187 A | 5/1998 | Wollin |
| 5,784,333 A | 7/1998 | Tang et al. |
| 5,827,952 A | 10/1998 | Mansure et al. |
| 5,986,454 A | 11/1999 | Leifer |
| 6,069,106 A | 5/2000 | Hettinger, Jr. |
| 6,090,728 A | 7/2000 | Yenni, Jr. et al. |
| 6,107,796 A | 8/2000 | Prammer |
| 6,178,807 B1 | 1/2001 | Baldwin et al. |
| 6,215,304 B1 | 4/2001 | Slade |
| 6,268,726 B1 | 7/2001 | Prammer et al. |
| 6,362,619 B2 | 3/2002 | Prammer et al. |
| 6,412,337 B1 | 7/2002 | Arzate et al. |
| 6,421,337 B1 | 7/2002 | Rao et al. |
| 6,452,390 B1 | 9/2002 | Wollin |
| 6,507,191 B1 | 1/2003 | Eguchi et al. |
| 6,518,758 B1 | 2/2003 | Speier et al. |
| 6,549,007 B1 | 4/2003 | Hills et al. |
| 6,550,327 B1 | 4/2003 | Van Berk |
| 6,646,437 B1 | 11/2003 | Chitale et al. |
| 6,807,857 B2 | 10/2004 | Storm, Jr. et al. |
| 6,856,132 B2 | 2/2005 | Appel et al. |
| 6,907,375 B2 | 6/2005 | Guggari et al. |
| 6,913,827 B2 | 7/2005 | George et al. |
| 6,952,096 B2 | 10/2005 | Freedman |
| 7,075,366 B2 | 7/2006 | Deem et al. |
| 7,295,933 B2 | 11/2007 | Gysling et al. |
| 7,352,179 B2 | 4/2008 | Chen et al. |
| 7,486,071 B2 | 2/2009 | Care et al. |
| 7,489,132 B2 | 2/2009 | Arik et al. |
| 7,570,058 B1 | 8/2009 | Wong et al. |
| 7,823,656 B1 | 11/2010 | Williams |
| 7,908,034 B2 | 3/2011 | Gray |
| 7,921,731 B2 | 4/2011 | Bajikar et al. |
| 8,024,962 B2 | 9/2011 | Tonmukayakul et al. |
| 8,143,887 B2 | 3/2012 | Pusiol |
| 8,256,532 B2 | 9/2012 | Gray |
| 8,373,412 B2 | 2/2013 | Kruspe et al. |
| 8,461,842 B2 | 6/2013 | Thuringer et al. |
| 8,469,118 B2 | 6/2013 | Passade-Boupat et al. |
| 8,736,263 B2 | 5/2014 | Minh |
| 8,763,170 B1 | 7/2014 | Ungarsohn |
| 8,763,710 B2 | 7/2014 | Graue |
| 8,791,695 B2 | 7/2014 | Balcom et al. |
| 8,807,084 B2 | 8/2014 | Rapoport et al. |
| 8,812,236 B1 | 8/2014 | Freeman et al. |
| 8,851,018 B2 | 10/2014 | Rapoport et al. |
| 8,896,310 B2 | 11/2014 | Rapoport |
| 9,194,972 B2 | 11/2015 | Van Der Zwaag et al. |
| 9,448,093 B2 | 9/2016 | Rapoport |
| 9,476,847 B2 | 10/2016 | Trygstad et al. |
| 2002/0173717 A1 | 11/2002 | Rohling et al. |
| 2003/0006768 A1 | 1/2003 | Kleinberg et al. |
| 2004/0017193 A1 | 1/2004 | Speier |
| 2004/0090230 A1 | 5/2004 | Appel et al. |
| 2004/0116799 A1 | 6/2004 | Srinivasan |
| 2004/0127786 A1 | 7/2004 | Schmit et al. |
| 2004/0140800 A1 | 7/2004 | Madio et al. |
| 2004/0169512 A1 | 9/2004 | Jara |
| 2005/0011283 A1 | 1/2005 | Gysling et al. |
| 2005/0024053 A1 | 2/2005 | Care et al. |
| 2005/0030020 A1 | 2/2005 | Siess et al. |
| 2005/0044957 A1 | 3/2005 | Muldowney |
| 2005/0203420 A1 | 9/2005 | Kleen et al. |
| 2006/0011547 A1 | 1/2006 | Bell |
| 2006/0213283 A1* | 9/2006 | Morris .................. G01R 33/44 73/861.12 |
| 2006/0279283 A1 | 12/2006 | Nistler et al. |
| 2007/0061081 A1 | 3/2007 | Moran |
| 2007/0164737 A1* | 7/2007 | Pusiol .................. G01R 33/44 324/306 |
| 2007/0188172 A1 | 8/2007 | Garwood et al. |
| 2008/0136409 A1 | 6/2008 | Sen et al. |
| 2008/0174309 A1 | 7/2008 | Pusiol et al. |
| 2008/0174313 A1* | 7/2008 | Ganesan ............. G01N 24/081 324/313 |
| 2008/0180226 A1 | 7/2008 | Schmidt |
| 2008/0189456 A1 | 8/2008 | Schmidt et al. |
| 2008/0257413 A1 | 10/2008 | Noureldin et al. |
| 2009/0004748 A1 | 1/2009 | Ganesan |
| 2009/0044638 A1 | 2/2009 | Gysling et al. |
| 2009/0050318 A1 | 2/2009 | Kasevich |
| 2009/0050369 A1 | 2/2009 | Pop et al. |
| 2009/0072824 A1 | 3/2009 | Romero |
| 2009/0090504 A1 | 4/2009 | Weightman et al. |
| 2009/0194330 A1 | 8/2009 | Gray |
| 2009/0312963 A1 | 12/2009 | Najim Al-Khamis |
| 2009/0312964 A1 | 12/2009 | Najim Al-Khamis |
| 2010/0133488 A1 | 6/2010 | Giakos |
| 2010/0154325 A1 | 6/2010 | Boesel et al. |
| 2010/0264914 A1 | 10/2010 | Minh |
| 2010/0271019 A1 | 10/2010 | Anand et al. |
| 2011/0036584 A1 | 2/2011 | Weightman et al. |
| 2011/0125333 A1 | 5/2011 | Gray |
| 2011/0162652 A1 | 7/2011 | Rapoport |
| 2011/0185795 A1 | 8/2011 | Colquhoun |
| 2011/0186049 A1 | 8/2011 | Rapoport |
| 2011/0234347 A1 | 9/2011 | Rapoport |
| 2011/0270525 A1 | 11/2011 | Hunter |
| 2011/0296911 A1 | 12/2011 | Moore et al. |
| 2011/0304333 A1 | 12/2011 | Rapoport |
| 2012/0013335 A1 | 1/2012 | Saasen et al. |
| 2012/0024602 A1 | 2/2012 | Larson |
| 2012/0065491 A1 | 3/2012 | Borgert et al. |
| 2012/0071745 A1 | 3/2012 | Rapoport |
| 2012/0073511 A1 | 3/2012 | Rapoport et al. |
| 2012/0077707 A1 | 3/2012 | Rapoport |
| 2012/0092007 A1* | 4/2012 | Li ........................ G01F 1/716 324/306 |
| 2012/0119742 A1 | 5/2012 | Rapoport |
| 2012/0205288 A1 | 8/2012 | Jia et al. |
| 2012/0212224 A1 | 8/2012 | Burns |
| 2012/0265050 A1 | 10/2012 | Wang |
| 2013/0009959 A1 | 1/2013 | Calamante et al. |
| 2013/0025062 A1 | 1/2013 | Esch |
| 2013/0060474 A1 | 3/2013 | Venkataramanan et al. |
| 2013/0079624 A1 | 3/2013 | Rapoport |
| 2013/0090855 A1 | 4/2013 | Rasmus et al. |
| 2013/0091941 A1 | 4/2013 | Huh et al. |
| 2013/0109956 A1 | 5/2013 | Rapoport |
| 2013/0123639 A1 | 5/2013 | Ando |
| 2013/0124106 A1 | 5/2013 | Rogel et al. |
| 2013/0154644 A1 | 6/2013 | Virtanen et al. |
| 2013/0179092 A1 | 7/2013 | Martin et al. |
| 2013/0237803 A1 | 9/2013 | Rapoport |
| 2013/0271135 A1 | 10/2013 | Ozen et al. |
| 2013/0328559 A1 | 12/2013 | Rapoport |
| 2013/0328560 A1 | 12/2013 | Rapoport |

(56) References Cited

U.S. PATENT DOCUMENTS

| | | |
|---|---|---|
| 2013/0328563 A1 | 12/2013 | Rapoport |
| 2013/0345994 A1 | 12/2013 | Wiklund et al. |
| 2014/0049257 A1 | 2/2014 | Rapoport |
| 2014/0050824 A1 | 2/2014 | Rapoport |
| 2014/0050827 A1 | 2/2014 | Rapoport |
| 2014/0051973 A1 | 2/2014 | Rapoport et al. |
| 2014/0051974 A1 | 2/2014 | Rapoport et al. |
| 2014/0051976 A1 | 2/2014 | Rapoport et al. |
| 2014/0099010 A1 | 4/2014 | Rapoport |
| 2014/0103927 A1 | 4/2014 | Rapoport |
| 2014/0117989 A1 | 5/2014 | Rapoport |
| 2014/0128725 A1 | 5/2014 | Rapoport |
| 2014/0139216 A1 | 5/2014 | Rapoport |
| 2014/0142914 A1 | 5/2014 | Rapoport |
| 2014/0152302 A1 | 6/2014 | Rapoport et al. |
| 2014/0152310 A1 | 6/2014 | Rapoport |
| 2014/0158062 A1 | 6/2014 | Rapoport et al. |
| 2014/0230850 A1 | 8/2014 | Rapoport |
| 2014/0253116 A1 | 9/2014 | Freedman et al. |
| 2014/0257081 A1 | 9/2014 | Rapoport |
| 2014/0262957 A1 | 9/2014 | Gong et al. |
| 2014/0266203 A1 | 9/2014 | Rapoport |
| 2014/0300358 A1 | 10/2014 | Rapoport |
| 2014/0309951 A1 | 10/2014 | Alvarez-Vallejos et al. |
| 2014/0333304 A1 | 11/2014 | Jensen |
| 2014/0354299 A1 | 12/2014 | Rapoport |
| 2014/0378821 A1 | 12/2014 | Rapoport et al. |
| 2014/0378825 A1 | 12/2014 | Rapoport et al. |
| 2015/0059157 A1 | 3/2015 | Rapoport |
| 2015/0059655 A1 | 3/2015 | Rapoport |
| 2015/0065788 A1 | 3/2015 | Rapoport |
| 2015/0084630 A1 | 3/2015 | Rapoport |
| 2015/0087051 A1 | 3/2015 | Rapoport |
| 2015/0112186 A1 | 4/2015 | Rapoport et al. |
| 2015/0130460 A1 | 5/2015 | Valori et al. |
| 2015/0137812 A1 | 5/2015 | Rapoport |
| 2015/0141799 A1 | 5/2015 | Rapoport et al. |
| 2015/0168519 A1 | 6/2015 | Rapoport |
| 2015/0268374 A1 | 9/2015 | Rapoport |
| 2015/0320888 A1 | 11/2015 | Yoneda et al. |
| 2015/0357694 A1 | 12/2015 | Denis et al. |
| 2015/0377998 A1 | 12/2015 | Bendel |
| 2016/0053187 A1 | 2/2016 | Hayasaka et al. |
| 2016/0108687 A1 | 4/2016 | Rapoport |
| 2016/0109539 A1 | 4/2016 | Mardor et al. |
| 2017/0243681 A1 | 8/2017 | Somerkoski et al. |

FOREIGN PATENT DOCUMENTS

| | | |
|---|---|---|
| CN | 1422324 | 6/2003 |
| CN | 1427877 | 7/2003 |
| CN | 1590994 | 3/2005 |
| CN | 101421636 | 4/2009 |
| CN | 101556234 | 10/2009 |
| CN | 101581717 | 11/2009 |
| CN | 101632584 | 1/2010 |
| CN | 101793147 | 8/2010 |
| CN | 101907586 | 12/2010 |
| CN | 103217362 | 7/2013 |
| CN | 103542899 | 1/2014 |
| CN | 103712071 | 4/2014 |
| CN | 103954639 | 7/2014 |
| DE | 202014105273 | 11/2014 |
| EP | 0 210 289 | 2/1987 |
| EP | 0770660 | 5/1997 |
| EP | 0835463 | 8/2003 |
| EP | 1532460 | 5/2005 |
| EP | 2604996 | 6/2013 |
| EP | 2927420 A2 | 10/2015 |
| EP | 2927420 A3 | 2/2016 |
| GB | 2341685 A | 7/1999 |
| RU | 2229023 | 5/2004 |
| RU | 2285119 | 10/2006 |
| RU | 2367982 | 9/2009 |
| SU | 876954 | 10/1981 |
| SU | 1041677 | 9/1983 |
| WO | WO1995018387 | 7/1995 |
| WO | WO2001002832 | 1/2001 |
| WO | WO2001051588 | 7/2001 |
| WO | WO2001051589 | 7/2001 |
| WO | WO2008008447 | 1/2008 |
| WO | WO2008043373 | 4/2008 |
| WO | WO2010000055 | 1/2010 |
| WO | WO2011095600 | 8/2011 |
| WO | WO2012004797 | 1/2012 |
| WO | WO2013009299 | 1/2013 |
| WO | WO2013162400 | 10/2013 |
| WO | WO2013179092 | 12/2013 |
| WO | WO2014004573 | 1/2014 |
| WO | WO2014203245 | 12/2014 |
| WO | WO2015070872 | 5/2015 |

OTHER PUBLICATIONS

ANSI/ISA SP76.00.2002 Miniature, Modular Mechanical Standard Specifications, 2002.
Arola et al., Use of nuclear magnetic resonance imaging as a viscometer for process monitoring, Chemical Engineering Science, 1997, 52(13), 2049-2057.
Bennett, et al. A nondestructive technique for determining thermal properties of thermal barrier coatings, Journal of Applied Physics, 2005, 97, 013520,1-12.
Bird et al. Transport Phenomena, Chapter. 2, Shell momentum balances and velocity distributions in laminar flow, Dec. 31, 2002, XP-002768172, Wiley, p. 54.
Caprihan, et al. Flow measurements by NMR, Physics Reports, (Review Section of Physics Letters)1990, 198, No. 4, 195-235.
Coussot et al., Rheological behavior of drilling muds, characterization using MRI visualization, Oil & Gas Science and Technology, Rev. IFP, 2004, vol. 59, No. 1, 23-29.
Degre et al., Rheology of complex fluids by particle image velocimetry in microchannels, Appl. Phys. Lett. 89(2), 024104, 2006, 1-3.
Doble et al., Optimization of the relaxivity of MRI contrast agents: effects of poly(ethylene glycol) chains on the water-exchange rates of Gd complexes, J. Am. Chem. Soc. 2001, 123, 10758-10759.
Dogan et al., Measurement of polymer melt rheology using ultrasonics-based in-line rheometry, Meas. Sci. Technol.,2005, 16(8):1684-1690.
Dyverfeldt et al., Quantification of intravoxel velocity standard deviation and turbulence intensity by generalizing phase-contrast MRI, Magnetic Resonance in Medicine, 2006, 56:850-858.
Felemban, et al. RFID for Oil and Gas Industry: Applications and Challenges, International Journal of Engineering and Innovative Technology (IJEIT) vol. 3, Issue 5, Nov. 2013, 20-85.
Goloshevsky et al., Nuclear magnetic resonance imaging for viscosity measurements of non-Newtonian fluids using a miniaturized RF coil, Meas. Sci. Technol., 2005, 16:513-518.
Gunnerod et al., Highly automated drilling fluids system improves HSE and efficiency, reduced personnel needs, Drilling Contractor, Heath, Safety & Environment, Jan/Feb 2009, 73-77.
Guzel et al., Predicting laminar-turbulent transition in Poiseuille pipe flow for non-Newtonian fluids, Chemical Engineering Science 2009, 64 (2) 254-264.
Hou et al., Review Article, Instrument techniques for rheometry, Review of Scientific Instruments, 2005, 76, 101101, 1-19.
Hsu et al., Encoding to the longitudinal magnetization for MR imaging and flow velocity mapping, Journal of Magnetic Resonance, 2006, 183,41-49.
International Electromechanical Commission in publication, IEC 62339-1:2006, 2006.
Kose, Katsumi, Visualization of local shearing motion in turbulent fluids using echo-planar imaging, Journal of Magnetic Resonance, 1992, 96, 596-603.
Lucas et al., An Iterative Image Registration Technique with an Application to Stereo Vision, Proceedings of Imaging Understanding Workshop, pp. 121-130 (1981).

(56) References Cited

OTHER PUBLICATIONS

Macgowan et al., Fast measurements of the motion and velocity spectrum of blood using MR tagging, Magnetic Resonance in Medicine, 2001, 45:461-469.
Ocali et al., Ultimate intrinsic signal-to-noise ratio in MRI, MRM, 1998, 39:462-473.
Pohost et al., Nuclear magnetic resonance imaging: With or without nuclear?, JACC Mar. 1986, vol. 7, No. 3, 709-710.
Poole et al., Development-Length Requirements for Fully Developed Laminar Pipe Flow of Inelastic Non-Newtonian Liquids, Journal of Fluids Engineering, Oct. 2007, vol. 129, 1281-1287.
Poulichet et al., Optimisation and realisation of a portable NMR apparatus and Micro Antenna for NMR, DTIP, May 2011, 11-13, Aix-en-Provence, France.
Prammer et al., The magnetic resonance while-drilling tool: theory and operation, Society of Engineers, 2000, SPE62981, 1-8.
Rabideau et al., The extrusion of a model yield stress fluid imaged by MRI velocimetry, J. Non-Newtonian Fluid Mech, 2010, 165, 394-408.
Shadday Jr., M.A., Recommendations for rheological testing and modelling of DWPF meter feed slurries (U), Engineering & Materials Technology Dept., WSRC-TR-94-0357, 1994 pp. 1-45.
Bradley Jr. et al., The appearance of rapidly flowing blood on magnetic resonance images, AJR, Dec. 1984, 143:1167-1174.
Yan, Jienian, Drilling Fluids Technology, May 31, 2001, China University of Petroleum Press, pp. 61-66.

\* cited by examiner

SYSTEM AND METHOD FOR MEASURING VELOCITY PROFILES

CROSS REFERENCE TO RELATED APPLICATIONS

This application claims priority to and the benefit of Provisional Application No. 62/321,507, filed Apr. 12, 2016, the entire contents of which are incorporate herein by reference in their entireties.

FIELD OF THE INVENTION

Generally, the invention relates to measurements of velocity profiles in fluids. In particular, the invention relates to magnetic resonance imaging (MRI) methods for measuring velocity profiles in flows of drilling mud.

BACKGROUND OF THE INVENTION

In magnetic resonance imaging (MRI), some measurements of certain types of drilling mud flowing in a conduit or pipe can be lost, particularly as most of the signal that originates at the edges of the pipe corresponds to low velocity and high shear rate. Such signal loss can be evident even in simple spin-echo (SE) images, e.g. images that do not have any intentional velocity-encoding gradients. The degree of signal loss in such measurements can show a positive correlation with echo time and flow rate.

Some methods for measuring a flowing fluid in a conduit to obtain velocity profiles include applying a magnetic pulse to the flowing fluid (e.g., drilling mud) and receiving a response signal. The magnetic pulse applied to the flowing fluid can cause encoding of the velocity information in the response signal (e.g., measurements) in a magnetization direction that is perpendicular to the direction of flow of the fluid within the pipe (e.g., transverse magnetization encoding of velocity information). However, such measurements typically can have signal loss such that the velocity profile may not be accurate. Thus, finding an accurate MRI method for measuring velocity profiles in drilling mud remains a long-felt yet unmet need.

SUMMARY OF THE INVENTION

One advantage of the invention includes a reduction in an echo time of a magnetic pulse by encoding velocity information of a fluid affected by the pulse into a longitudinal magnetization of the pulse.

An additional advantage of the invention can be due to the fact that the velocity determination is entirely 'model-free', in the sense that it does not depend on any modeling of how relaxation (longitudinal or transverse) may affect the results, since the results can be independent on spin relaxation and depend only on the flow rate itself.

There is thus provided, in accordance with some embodiments of the invention, a method of determining a velocity profile of a fluid flowing through a conduit, the method including applying a saturation pulse on spins of magnetic field-sensitive nuclei in the fluid, measuring a signal of the fluid to determine position of the magnetic field-sensitive nuclei, the measurement carried out at a recovery time 'TR' and at a distance within the conduit, determining within the conduit a radial distance 'r' characterized by a local minimum in the measured signal, wherein the radial distance 'r' is measured from the center of the conduit, and determining a velocity profile of the fluid at the radial distance, based on the magnetic field-sensitive nuclei.

In some embodiments, the position of the local minimum in the signal corresponds to the local flow velocity. In some embodiments, applying a saturation pulse is carried out for a tagging slice of the fluid located at a predetermined position along said flow. In some embodiments, the measurement is carried out for a corresponding readout slice of the fluid, and wherein the readout slice is at a predetermined distance from the tagging slice.

In some embodiments, the method includes encoding the velocity in a direction parallel to the flow of the fluid within the conduit. In some embodiments, the method further includes encoding the velocity in a direction perpendicular to the flow of the fluid within the conduit, and comparing the measured velocity in both directions to determine the velocity profile. In some embodiments, the method includes measuring the intensity of the signal as a function of position.

In some embodiments, the measurement is carried out for low flow regions near the wall of the conduit. In some embodiments, the method further includes varying the value of 'd', and determining a velocity profile v(r) as a function of radial distance 'r'.

In some embodiments, the saturation pulse on spins is a Spin Echo pulse sequence. In some embodiments, the saturation pulse sequence is an echo time 'TE' sequence. In some embodiments, the saturation pulse is characterized by a flip angle >90° selected such that the local minimum in said signal is equal to zero. In some embodiments, the fluid comprises drilling mud.

There is thus provided, in accordance with some embodiments of the invention, a method of determining a velocity profile of a fluid flowing through a conduit, the method including measuring a signal of the fluid to determine position of magnetic field-sensitive nuclei in the fluid, normalizing the signal, applying a saturation pulse on spins of magnetic field-sensitive nuclei in the fluid, measuring a normalized signal of the fluid, carried out at a recovery time 'TR' and at a distance within the conduit, determining within the conduit a radial distance 'r' characterized by a local minimum in the normalized signal, wherein the radial distance 'r' is measured from the center of the conduit, determining a velocity profile of the fluid at the radial distance, based on the magnetic field-sensitive nuclei.

BRIEF DESCRIPTION OF THE DRAWINGS

Non-limiting examples of embodiments of the disclosure are described below with reference to figures attached hereto that are listed following this paragraph. Dimensions of features shown in the figures are chosen for convenience and clarity of presentation and are not necessarily shown to scale.

The subject matter regarded as the invention is particularly pointed out and distinctly claimed in the concluding portion of the specification. The invention, however, both as to organization and method of operation, together with objects, features and advantages thereof, can be understood by reference to the following detailed description when read with the accompanied drawings. Embodiments of the invention are illustrated by way of example and not limitation in the figures of the accompanying drawings, in which like reference numerals indicate corresponding, analogous or similar elements, and in which:

DETAILED DESCRIPTION OF THE SOME EMBODIMENTS

Although embodiments of the invention are not limited in this regard, discussions utilizing terms such as, for example, "processing," "computing," "calculating," "determining," "establishing", "analyzing", "checking", or the like, can refer to operation(s) and/or process(es) of a computer, a computing platform, a computing system, or other electronic computing device, that manipulates and/or transforms data represented as physical (e.g., electronic) quantities within the computer's registers and/or memories into other data similarly represented as physical quantities within the computer's registers and/or memories or other information non-transitory storage medium that can store instructions to perform operations and/or processes. Although embodiments of the invention are not limited in this regard, the terms "plurality" and "a plurality" as used herein can include, for example, "multiple" or "two or more" and can be used throughout the specification to describe two or more components, devices, elements, units, parameters, or the like.

As mentioned above, magnetic resonance imaging (MRI) based methods for measuring flow rates in conduits, particularly of such substances as oil in drilling mud, can suffer from signal loss near the edges of the conduit, where the velocity is low but the shear rate is high. Possibly such signal loss can occur due to the magnetic attributes of drilling mud particles that are affected by the magnetic field.

It should be appreciated that the invention disclosed herein can overcome the signal loss near the edges of the conduit, with reduction of the echo time in measurements while maintaining encoding of velocity information with a magnetization direction that is perpendicular to the direction of flow of the fluid in the conduit, by, for example, applying a magnetic pulse to a fluid flowing through the pipe such that the velocity information is encoded into the response signal (e.g., measurements) with a magnetization direction that is parallel to the direction of flow of the fluid in the conduit (e.g., longitudinal magnetization encoding of the velocity information). The longitudinal direction of flow in the conduit can defines the 'Z' axis. In this manner, the response pulse can provide velocity information that is more accurate than velocity information obtained by transverse magnetization encoding of the velocity information, and with such encoding of velocity information into the longitudinal magnetization, signal detection at arbitrary short echo time values can be allowed.

Figure 1:
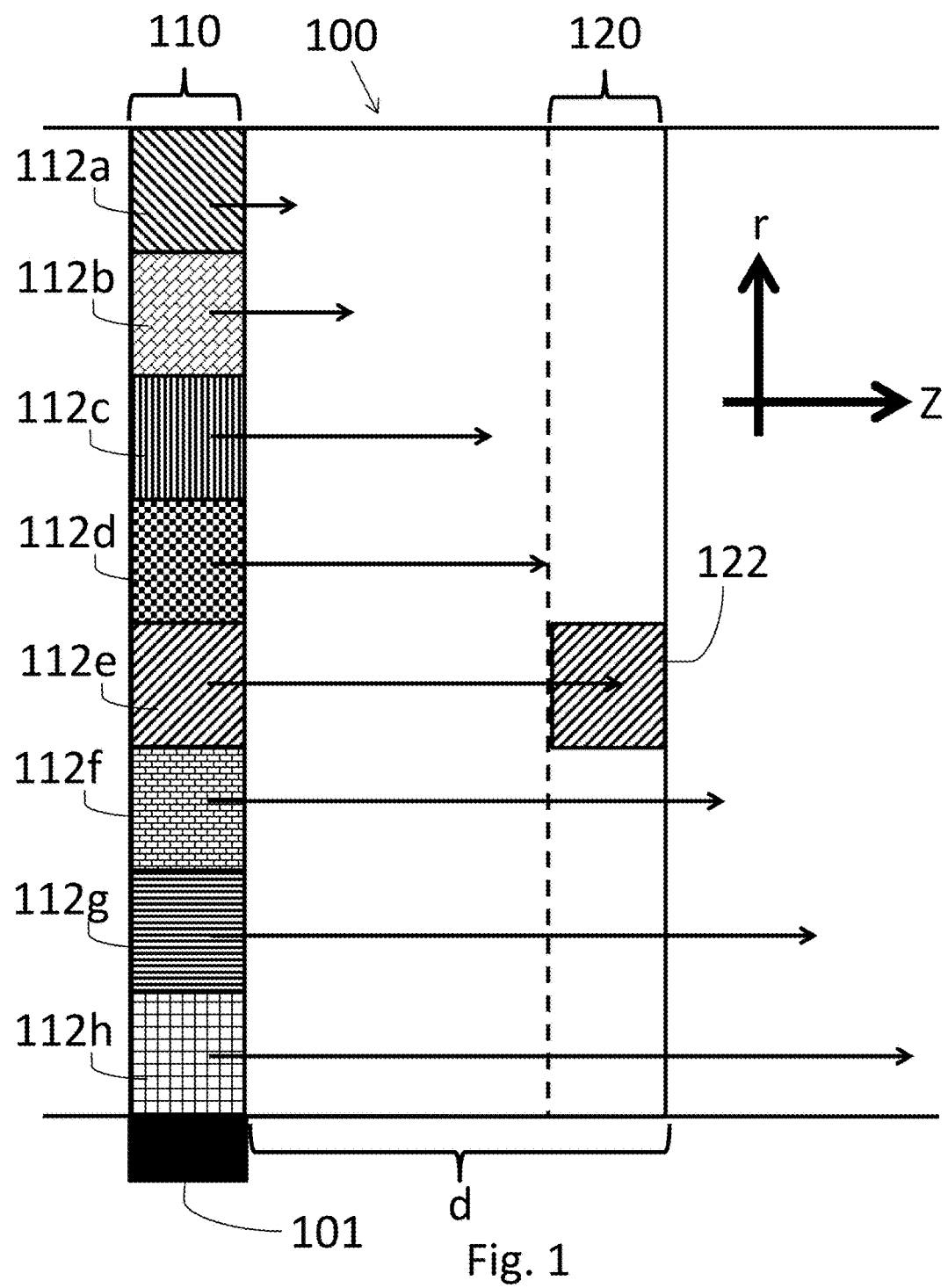
FIG. 1 schematically illustrates a cross-sectional view of fluid flow within a conduit, according to an illustrative embodiment of the invention.

Reference is now made to FIG. 1, which schematically illustrates a cross-sectional view of fluid flow s within a conduit 100, according to some embodiments of the invention. The fluid (e.g., drilling mud) flowing within the conduit 100 may include magnetic field-sensitive nuclei, so that in order to measure properties of the fluid a dedicated magnetic field may be applied onto the conduit 100 at a predetermined position. For example, applying a magnetic field onto the conduit 100 with a magnetic resonance imaging (MRI) device 101.

According to some embodiments, a magnetic pulse (e.g., a saturation pulse and/or an inversion pulse) can be applied on the fluid magnetic field-sensitive nuclei. Each such nuclei has a spin direction that can be affected by the magnetic pulse, and the magnetic pulse can be applied to cause the spins of the nuclei to be aligned. Thus, the magnetic pulse can be applied in order to measure these nuclei at a different position within the conduit 100 and thereby determine properties of the fluid.

In a preparation stage, a predetermined initial position 110 is chosen within the conduit 100. In some embodiments, the initial position can be a slice within the conduit 100 through which the material of interest is flowing, for example a slice including a sufficiently small amount of nuclei to ensure proper magnetization properties. A magnetic pulse sequence can be applied to a plurality of slices 1124-112$h$ through the predetermined initial position 110 along the flow longitudinal direction of flow in the conduit 100 (indicated as the 'Z' axis in FIG. 1). A slice 112 can include a volume that is defined by two parallel planes that can be generally perpendicular to the direction of the flow ('Z') and the inner wall of the conduit 100. Such volume can be arbitrarily small and in some embodiments can be approximated as being equal to zero (e.g., a slice can be treated as being arbitrarily thin), such that the spins of nuclei within such volumes can be considered as parallel.

In some embodiments, the measurements can be made near the walls of the conduit, where it can be reasonable to assume that the flow rate can be slow enough that the signal has a uniform high intensity. In these embodiments, if the assumption is made and the assumption is wrong, and causes inaccuracies, the inaccuracies can be corrected by measuring the flowing fluid in the absence of the magnetic pulse and using the measured signal to normalize inaccuracies in the flow.

In a measurement stage, a predetermined measurement position 120 can be chosen within the conduit 100, at a distance 'd' from initial position 110 within the conduit 100. According to some embodiments, a response of the fluid to an applied magnetic field can be measured (e.g., measuring signal response to another magnetic pulse) after a recovery time 'TR'. Such measurement can be carried out to determine a position of the magnetic field-sensitive nuclei (corresponding to the magnetic field). During the recovery time 'TR' the magnetic field-sensitive nuclei with spins aligned during the preparation magnetic pulse sequence can flow down the conduit 100. After the recovery time 'TR', a measurement can be taken of at least one slice slice 122 located at the measurement position 120, such that the measured slice 122 includes the magnetic field-sensitive nuclei with spins aligned during the preparation magnetic pulse sequence.

In some embodiments, the magnetic pulse sequence can saturate the signal of the spins in the slices 112 (e.g., reducing the intensity to zero). Following the magnetic pulse sequence, the magnetic field-sensitive nuclei in these slices can travel toward a measured slice 122 located at a predetermined distance 'd' downstream from the location of the slice 112 in the conduit 100.

In some embodiments, only those spins that travel at velocity 'v' that meets the condition $$v = \frac{d}{TR}$$

can ailed inc signal intensity in the measurement slice 122. Due to the saturation of the signal by the initial magnetic pulse, the signal at a measurement slice 122 located at distance d=vTR can be strongly reduced relative to signals measured at all other values of 'd', since at 'TR', the spins prepared by the preparation pulse can either have flowed past that position (e.g., measurement position 120) or else they cannot yet have reached it. Thus, there can be a local minimum in the signal at d=vTR. Since 'TR' and 'd' are fixed, in order to determine 'v', it is sufficient to measure the signal produced by the readout pulse at a series of distances 'd' along the flow and to identify the radial position of the local minimum in the intensity profile of the measurement slice 122 at each value of 'd'. The flow velocity at the radial position corresponding to the local minimum can then be calculated from the known values of 'd' and 'TR'.

According to some embodiments, with such measurements there is no longer the need to lower the magnetic field strength in order to make the requisite measurements.

In various embodiments, such measurements can be repeated for a series of values of 'd' and/or for a series of spatial encoding steps for generating two-dimensional and/or three-dimensional mappings of slices that are perpendicular to the flow (e.g., perpendicular to the 'Z' axis). In some embodiments, the measurement sequence can be a short echo-rime 'TE', for example the standard spin-echo (SE) sequence. In some embodiments, the pulse sequence can be an ultra-short TE (UTE) sequence with spiral k-space sampling. In some embodiments, segmentation can be used in order to speed up the data acquisition.

In various embodiments, a radial distance 'r' characterized by a local minimum in the measured signal can be determined within the conduit 100, whereby the radial distance 'r' is measured from the center of the conduit 100 perpendicularly to the 'Z' axis. In some embodiments, a velocity profile of the fluid at the radial distance 'r' can be determined based on the magnetic field-sensitive nuclei. Thus, a velocity profile of the fluid can be provided for the magnetic field-sensitive nuclei of the fluid that received the pulse in the initial position 110, and since the distance 'd' and the time 'TR' are known the velocity can be determined.

In some embodiments, such measurements can provide a simple path to quantitative interpretation of the results (e.g., determination of the velocity as a function of the spatial coordinates). In some embodiments, only the identification of a minimum in the signal profile is required (e.g., related to the local flow velocity) such that only the position of a local minimum along the radial axis can be required. There can therefore be no requirement to determine the signal value at that minimum and/or determine the functional signal dependence around the minimum.

The measurement (imaging) pulse can produce a signal having intensity 'S(r)' that in can vary with spatial coordinate inside the conduit 100. In the absence of an initial magnetic pulse, 'S(r)' can be expected to vary depending on the velocity. For example, 'S(r)' can be expected to be lower at high flow rates (e.g., near the center of the conduit 100).

It should be noted that the measurements disclosed herein can be directed toward measurements made in the low flow region near the wall of the conduit 100, and in any case, high flow rate regions can be imaged successfully by standard MRI-based methods known in the art.

It should be noted that since such measurements only depend on finding a local minimum in the readout signal as a function of radial position at 'd', this local minimum may not require to be be zero, given that the spins will start recovering immediately after the initial magnetic pulse has ceased. In some embodiments of the invention, the flip angle of preparation pulse can be >90° and can be empirically chosen such that the local minimum at will be equal to zero.

According to some embodiments, the velocity in a direction parallel to the flow of the fluid within the conduit 100 can be encoded, and the velocity in a direction perpendicular to the flow of the fluid within the conduit 100 can be encoded. Thus, the measured velocity in both directions can be compared so as to determine the velocity profile.

In some embodiments, the readout signal measurement can be carried out without having first obtained a preparation pulse to normalize the measurements.

Figure 2:
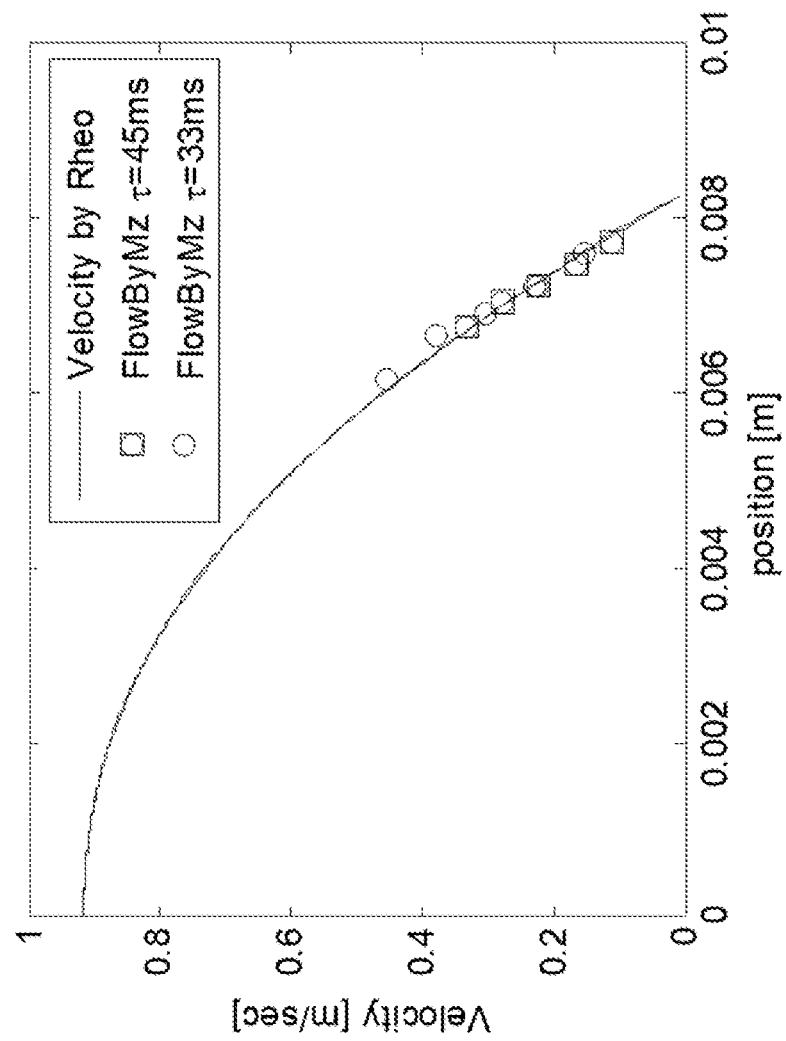
FIG. 2 shows a graph comparing exemplary results of measurements as described herein for FIG. 1 for a flow of glycerol through a 16 millimeter diameter conduit, according to an illustrative embodiment of the invention.
Figures 3A, 3B, 3C, 3D, 3E:
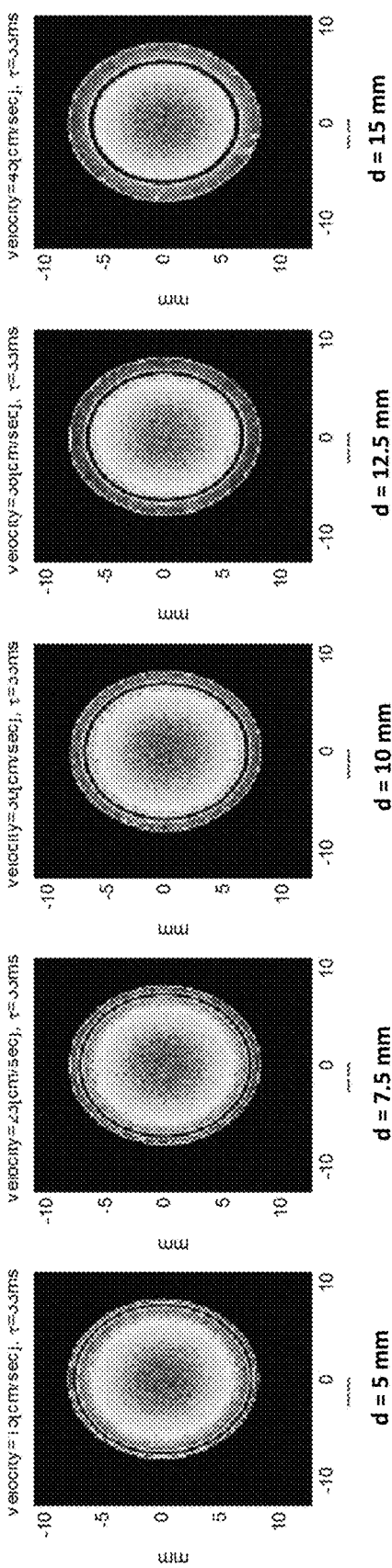
FIG. 3A-3E show a series of velocity profile measurements, according to illustrative embodiments of the invention.

Reference is now made to FIG. 2, which shows a graph comparing exemplary results of measurements as described herein for FIG. 1 for a flow of glycerol through a 16 millimeter diameter conduit, according to some embodiments of the invention.

Exemplary velocity profiles were obtained for glycerol flowing through a 16 millimeter diameter conduit by the method disclosed in the present invention and by a conventional method. A comparison was made of the method disclosed herein with previously available rheological methods for measuring flow rates.

Open circles 210 indicate the velocity profiles obtained by the method disclosed herein for two values of 'TR' (33 milliseconds and 45 milliseconds). A solid line 220 indicates the velocity profile obtained by previously available rheological methods for measuring flow rates. As can be seen in the figure, the method herein disclosed accurately reproduces the flow velocity profile obtained by conventional methods, even at the outer edge of the conduit where the velocity approaches zero.

Reference is now made to FIGS. 3A-3E, which show a series of velocity profile measurements, according to some embodiments of the invention. For these measurements, 'TR'=33 milliseconds was chosen. Each figure shows a contour plot of the velocity profile signal as a function of radial distance 'r' through the conduit for a series of slices measured at distances varying from 5 to 15 millimeters. The results are summarized in Table 1:

TABLE 1

| FIG. | distance 'd' [mm] | velocity 'v' [cm/s] |
|---|---|---|
| 3A | 5 | 15 |
| 3B | 7.5 | 23 |
| 3C | 10 | 30 |
| 3D | 12.5 | 38 |
| 3E | 15 | 45 |

It should be noted at these figures, as the value of increases, the local minimum in the signal, which appears on the figures as a dark ring, moves toward the center of the conduit. This can indicate that the flow rate near the center of the conduit is significantly higher than the flow rate near the wall of the conduit.

Figure 4:
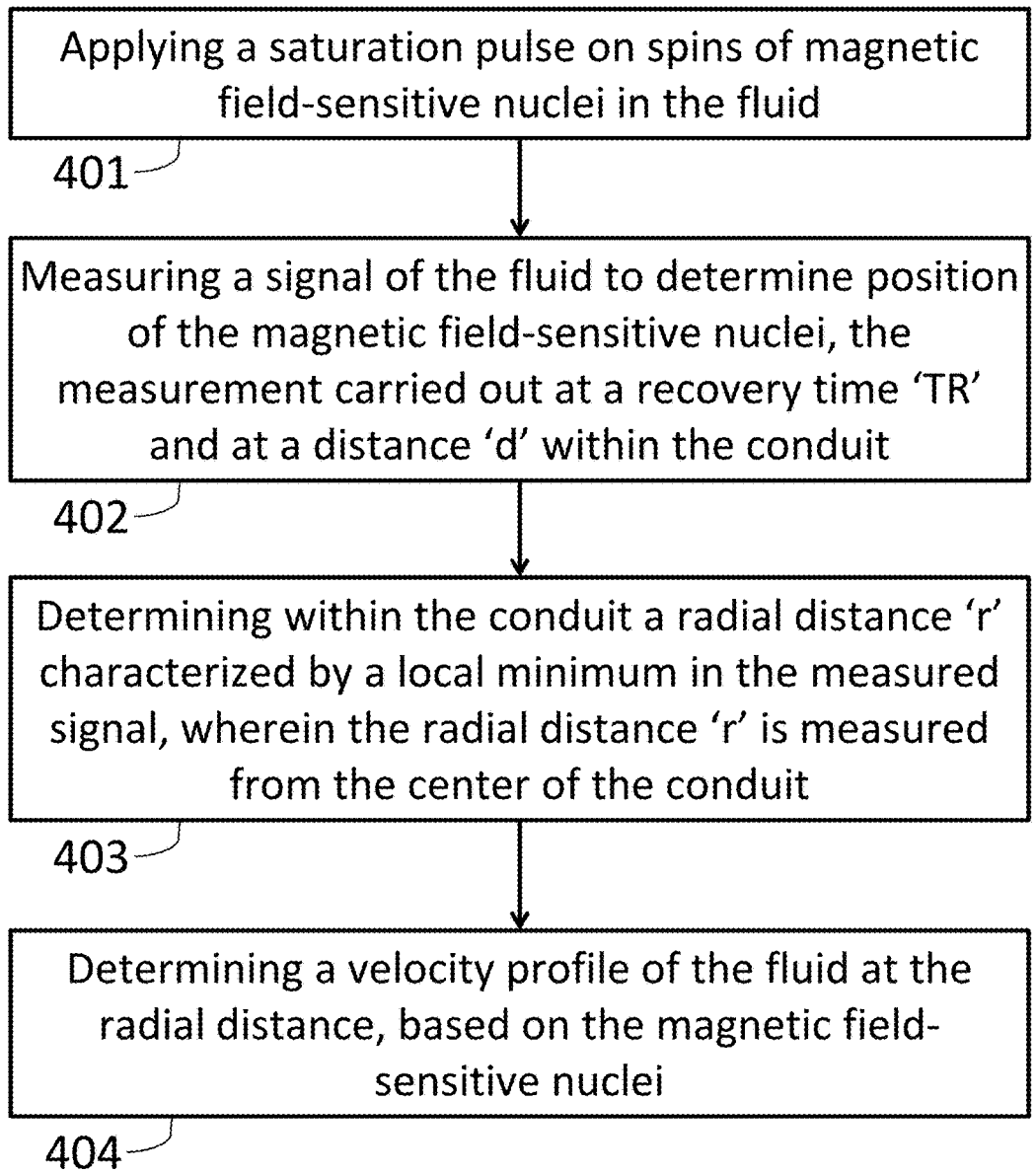
FIG. 4 shows a flowchart for a method of determining a velocity profile of a fluid flowing through a conduit, according to illustrative embodiments of the invention.

Reference is now made to FIG. 4, which shows a flowchart for a method of determining a velocity profile of a fluid flowing through a conduit, according to some embodiments of the invention. The method can include applying 401 a saturation pulse on spins of magnetic field-sensitive nuclei in the fluid. For example, applying a magnetic saturation pulse on spins of magnetic field-sensitive nuclei in drilling mud.

The method can further include measuring 402 a signal of the fluid to determine position of the magnetic field-sensitive nuclei, the measurement carried out at a recovery time 'TR' and at a distance within the conduit. For example, conduit 100 as shown in FIG. 1.

The method can further include determining 403 within the conduit a radial distance 'r' characterized by a local minimum in the measured signal, wherein the radial distance 'r' is measured from the center of the conduit. The method can further include determining 404 a velocity profile of the fluid at the radial distance, based on the magnetic field-sensitive nuclei.

Unless explicitly stated, the method embodiments described herein are not constrained to a particular order or sequence. Additionally, some of the described method embodiments or elements thereof can occur or be performed simultaneously, at the same point in time, or concurrently.

The invention claimed is:

1. A method of determining a velocity profile of a fluid flowing through a conduit, the method comprising:
    applying a saturation pulse on spins of magnetic field-sensitive nuclei in the fluid;
    measuring a signal of the fluid to determine position of the magnetic field-sensitive nuclei, the measurement carried out at a recovery time 'TR' and at a distance within the conduit;
    determining within the conduit a radial distance 'r' characterized by a local minimum in the measured signal, wherein the radial distance 'r' is measured from the center of the conduit; and
    determining a velocity profile of the fluid at the radial distance, based on the magnetic field-sensitive nuclei.

2. The method according to claim 1, the position of the local minimum in the signal corresponds to the local flow velocity.

3. The method according to claim 1, wherein applying a saturation pulse is carried out for a tagging slice of the fluid located at a predetermined position along said flow.

4. The method according to claim 2, wherein the measurement is carried out for a corresponding readout slice of the fluid, and wherein the readout slice is at a predetermined distance from the tagging slice.

5. The method according to claim 1, comprising encoding the velocity in a direction parallel to the flow of the fluid within the conduit.

6. The method according to claim 5, further comprising:
    encoding the velocity in a direction perpendicular to the flow of the fluid within the conduit; and
    comparing the measured velocity in both directions to determine the velocity profile.

7. The method according to claim 1, comprising measuring the intensity of the signal as a function of position.

8. The method according to claim 1, wherein the measurement is carried out for low flow regions near the wall of the conduit.

9. The method according to claim 1, further comprising:
    varying the value of 'd'; and
    determining a velocity profile v(r) as a function of radial distance 'r'.

10. The method according to claim 1, wherein the saturation pulse on spins is a Spin Echo pulse sequence.

11. The method according to claim 1, wherein the saturation pulse sequence is an echo time 'TE' sequence.

12. The method according to claim 1, wherein the saturation pulse is characterized by a flip angle >90° selected such that the local minimum in said signal is equal to zero.

13. The method according to claim 1, wherein the fluid comprises drilling mud.

14. A method of determining a velocity profile of a fluid flowing through a conduit, the method comprising:
    measuring a signal of the fluid to determine position of magnetic field-sensitive nuclei in the fluid;
    normalizing the signal;
    applying a saturation pulse on spins of magnetic field-sensitive nuclei in the fluid;
    measuring a normalized signal of the fluid, carried out at a recovery time 'TR' and at a distance within the conduit;
    determining within the conduit a radial distance 'r' characterized by a local minimum in the normalized signal, wherein the radial distance 'r' is measured from the center of the conduit; and
    determining a velocity profile of the fluid at the radial distance, based on the magnetic field-sensitive nuclei.

* * * * *